(12) United States Patent
Unno

(10) Patent No.: US 11,367,631 B2
(45) Date of Patent: Jun. 21, 2022

(54) CERAMIC HEATER AND MANUFACTURING METHOD FOR TUBULAR SHAFT

(71) Applicant: NGK INSULATORS, LTD., Nagoya (JP)

(72) Inventor: Yutaka Unno, Handa (JP)

(73) Assignee: NGK Insulators, Ltd., Nagoya (JP)

(\*) Notice: Subject to any disclaimer, the term of this patent is extended or adjusted under 35 U.S.C. 154(b) by 307 days.

(21) Appl. No.: 16/547,754

(22) Filed: Aug. 22, 2019

(65) Prior Publication Data

US 2020/0075361 A1 Mar. 5, 2020

(30) Foreign Application Priority Data

Aug. 29, 2018 (JP) .............................. JP2018-160303

(51) Int. Cl.
| | | |
|---|---|---|
| *H05B 3/68* | (2006.01) | |
| *H01L 21/67* | (2006.01) | |
| *H01L 21/683* | (2006.01) | |
| *H05B 3/06* | (2006.01) | |
| *H05B 3/26* | (2006.01) | |
| *H01J 37/32* | (2006.01) | |
| *F27D 5/00* | (2006.01) | |

(52) U.S. Cl.
CPC .. *H01L 21/67103* (2013.01); *H01J 37/32724* (2013.01); *H01L 21/6838* (2013.01); *H05B 3/06* (2013.01); *H05B 3/265* (2013.01); *F27D 5/0031* (2013.01)

(58) Field of Classification Search
CPC .... A45D 2/18; F27D 5/0031; H01J 37/32724; H01L 21/67103; H01L 21/67248; H01L 21/6838; H01L 21/68757; H01L 21/68785; H01L 21/68792; H05B 3/06; H05B 3/265

USPC ........................................... 219/443.1–468.2
See application file for complete search history.

(56) References Cited

U.S. PATENT DOCUMENTS 1,887,155 A \* 11/1932 Harnsberger ............. F28F 1/36
196/110
4,014,369 A \* 3/1977 Kobres, Jr. ............. F16L 59/06
138/112

(Continued)

FOREIGN PATENT DOCUMENTS

| JP | 2783980 B2 | 8/1998 |
| JP | 3316167 B2 | 8/2002 |

(Continued)

OTHER PUBLICATIONS

Japanese Office Action (Application No. 2018-160303) dated Mar. 2, 2021 (with English translation).

(Continued)

*Primary Examiner* — Sang Y Paik
(74) *Attorney, Agent, or Firm* — Burr & Brown, PLLC

(57) ABSTRACT

A ceramic heater includes a ceramic plate having a wafer placement surface on which a wafer is to be placed, and incorporating a resistance heating element therein, and a ceramic tubular shaft having one end joined to a rear surface of the plate. The tubular shaft has a vertical sectional shape including an S-like portion or a curved portion having an inflection point in at least one position, and includes a through-hole penetrating the tubular shaft from the one end to the other end with an axis extending along the vertical sectional shape of the tubular shaft.

7 Claims, 7 Drawing Sheets

(56) References Cited

U.S. PATENT DOCUMENTS

| | | |
|---|---|---|
| 5,721,062 A | 2/1998 | Kobayashi |
| 6,028,022 A | 2/2000 | Ohashi |
| 6,261,708 B1 | 7/2001 | Ohashi et al. |
| 2006/0182908 A1 | 8/2006 | Fujii |
| 2006/0219176 A1* | 10/2006 | Tomita .............. H01L 21/67103 118/725 |
| 2007/0221648 A1 | 9/2007 | Unno et al. |
| 2009/0031955 A1* | 2/2009 | Lu ....................... C23C 16/4584 118/728 |
| 2009/0235866 A1 | 9/2009 | Kataigi et al. |
| 2010/0163183 A1* | 7/2010 | Tanaka .............. H01L 21/67248 156/345.27 |
| 2011/0062144 A1 | 3/2011 | Akatsuka et al. |
| 2013/0248509 A1* | 9/2013 | Unno ................... H05B 1/0233 219/444.1 |
| 2016/0002779 A1* | 1/2016 | Lin ........................ C23C 16/50 118/500 |
| 2018/0076067 A1 | 3/2018 | Kitabayashi et al. |
| 2018/0204754 A1 | 7/2018 | Tokusho et al. |

FOREIGN PATENT DOCUMENTS

| | | |
|---|---|---|
| JP | 2007-258115 A1 | 10/2007 |
| JP | 4070752 B2 | 4/2008 |
| JP | 2009-010195 A1 | 1/2009 |
| JP | 2009-256789 A1 | 11/2009 |
| JP | 5008875 B2 | 8/2012 |
| JP | 2017-162878 A1 | 9/2017 |
| JP | 2018-046079 A1 | 3/2018 |
| KR | 10-2009-0101093 A | 9/2009 |
| KR | 10-2010-0031110 A | 3/2010 |
| KR | 10-2011-0030409 A | 3/2011 |

OTHER PUBLICATIONS

Korean Office Action (Application No. 10-2019-0103418) dated Oct. 21, 2020 (with English translation).

* cited by examiner

CERAMIC HEATER AND MANUFACTURING METHOD FOR TUBULAR SHAFT

BACKGROUND OF THE INVENTION

1. Field of the Invention

The present invention relates to a ceramic heater and a manufacturing method for a tubular shaft.

2. Description of the Related Art

There has hitherto been known a ceramic heater that includes a ceramic plate having a wafer placement surface on which a wafer is to be placed, the ceramic plate incorporating a resistance heating element therein, and a ceramic tubular shaft joined to a surface (rear surface) of the plate on the opposite side to the wafer placement surface. Patent Literature (PTL) 1 discloses a trumpet-shaped tubular shaft flaring upward, which is used in the above-mentioned type of ceramic heater. A lower end of the tubular shaft is attached to a base plate with an O-ring interposed between them. An insertion path through which a thermocouple is to be inserted is formed along a height direction in part of an outer wall of the tubular shaft. The insertion path is constituted by a recessed groove formed in an outer wall of the tubular shaft and extending in the height direction, and by a lid member welded to be joined in a state closing the recessed groove.

CITATION LIST

Patent Literature

[PTL 1] Japanese Unexamined Patent Application Publication No. 2009-010195

SUMMARY OF THE INVENTION

However, PTL 1 has the following problem. The tubular shaft has the trumpet-like shape, but a path of heat transfer through the tubular shaft is comparatively short. Therefore, a high increase in temperature at a lower end surface of the tubular shaft is unavoidable. If the temperature at the lower end surface of the tubular shaft becomes too high, there is a possibility that the surface temperature may exceed the heat resistance temperature of an O-ring, and that the O-ring may no longer exhibit sufficient sealing performance. Furthermore, in PTL 1, because the insertion path has the structure in which the recessed groove is covered with the lid member, an external appearance is not so good, and detachment of the lid member may occur if the joining of the lid member is insufficient.

The present invention has been made with intent to solve the above-mentioned problem, and a main object of the present invention is to prevent a high increase in temperature at the lower end surface of the tubular shaft, to provide a good external appearance of the tubular shaft, and to enable a through-hole structure to be maintained for a long period.

A ceramic heater of the present invention includes a ceramic plate having a wafer placement surface on which a wafer is to be placed, and incorporating a resistance heating element therein, and a ceramic tubular shaft having one end joined to a rear surface of the plate, wherein the tubular shaft has a vertical sectional shape including an S-like portion or a curved portion having an inflection point in at least one position, and includes a through-hole penetrating the tubular shaft from the one end to the other end with an axis extending along the vertical sectional shape of the tubular shaft.

In the above-described ceramic heater, the tubular shaft has a vertical sectional shape including an S-like portion or a curved portion having an inflection point in at least one position. Therefore, a path of heat transfer through the tubular shaft (i.e., a path extending from the one end to the other end of the tubular shaft) is prolonged, and a high increase in temperature at the other end surface of the tubular shaft can be avoided. Furthermore, since the through-hole penetrating the tubular shaft from the one end to the other end is not formed by joining a lid member such as used in PTL 1, an external appearance is good and a through-hole structure can be maintained for a long period.

In the ceramic heater according to the present invention, the through-hole may be a gas path, and the plate may include a gas flow hole communicating with the through-hole and penetrating the plate in a thickness direction. In this case, since a medium passing through the through-hole of the tubular shaft is gas, it easily passes through the through-hole regardless of the shape of the through-hole. In other words, the gas easily passes through the through-hole even when the vertical sectional shape of the tubular shaft includes the S-like portion or the curved portion in two or more positions and the axis of the through-hole extends along the S-like or curved shape. With the vertical sectional shape of the tubular shaft including the S-like portion or the curved portion in two or more positions, a path of heat transfer through the tubular shaft can be relatively prolonged, and the high increase in temperature at the other end surface of the tubular shaft can be more reliably avoided. The gas path may be used to supply gas (e.g., heat conducting gas), via the gas flow hole, to a rear surface of the wafer placed on the wafer placement surface, or used for vacuum suction to evacuate gas, via the gas flow hole, from the rear surface of the wafer placed on the wafer placement surface.

In the ceramic heater according to the present invention, the through-hole may be a thermocouple installation hole, and the plate may include a bottom-equipped hole communicating with the thermocouple installation hole and having a bottom inside the plate. In this case, because a thermocouple, i.e., a tangible object, passes through the through-hole, the through-hole preferably has a comparatively simple shape. Thus, the vertical sectional shape of the tubular shaft preferably includes the S-like portion or the curved portion only in one position.

In the ceramic heater according to the present invention, the through-hole may be a hole having a diameter smaller than a wall thickness of the tubular shaft.

In the ceramic heater according to the present invention, the through-hole may be a tubular space between an inner circumferential wall and an outer circumferential wall of the tubular shaft, a horizontal section of the tubular space may have a ring-like shape concentric (error such as within tolerance is allowable) to a horizontal section of the tubular shaft, and a coupling portion partly coupling the inner circumferential wall and the outer circumferential wall may be disposed in the tubular space. With those features, since the tubular shaft has a smaller cross-sectional area, heat resistance in a path from the one end to the other end of the tubular shaft is increased. As a result, an amount of heat conducted from the one end to the other end of the tubular shaft is reduced, and a temperature difference between a portion of the plate, the portion being in contact with the tubular shaft, and the remaining portion is reduced or eliminated. Moreover, since thermal stress is also reduced, damage of the tubular shaft can be prevented during use. In addition, in the case of using the through-hole as a gas supply hole or a vacuum suction hole, local concentration of a gas flow can be more reliably prevented than the case of using the above-mentioned through-hole having a comparatively small diameter (i.e., a diameter smaller than the wall thickness of the tubular shaft), and thermal uniformity of the plate is improved.

In the ceramic heater according to the present invention, a wall thickness (length from the inner circumferential surface to the outer circumferential surface) of the tubular shaft may be 10 mm or less. With that feature, since the wall thickness of the tubular shaft is reduced, the thermal stress is reduced. The wall thickness of the tubular shaft is preferably 6 mm or more in consideration of the strength of the tubular shaft.

The present invention further provides a manufacturing method for a tubular shaft made of a ceramic, having a vertical sectional shape including an S-like portion or a curved portion having an inflection point in at least one position, and including a through-hole penetrating the tubular shaft from one end to the other end with an axis extending along the vertical sectional shape of the tubular shaft, the manufacturing method comprising steps of:

(a) fabricating a compact having the same or a similar shape as or to a shape of the tubular shaft with a 3D printer by using slurry containing ceramic powder, or fabricating a compact having the same or a similar shape as or to a shape of the tubular shaft with a mold casting method by using slurry containing ceramic powder; and (b) obtaining the tubular shaft by firing the fabricated compact.

According to the above-described manufacturing method, even when the tubular shaft has a comparatively complicated shape, i.e., the vertical sectional shape including the S-like portion or the curved portion having an inflection point in at least one position, and includes the through-hole penetrating the tubular shaft from the one end to the other end with the axis extending along the vertical sectional shape of the tubular shaft, the tubular shaft can be comparatively easily manufactured.

DETAILED DESCRIPTION OF THE INVENTION

Figure 1:
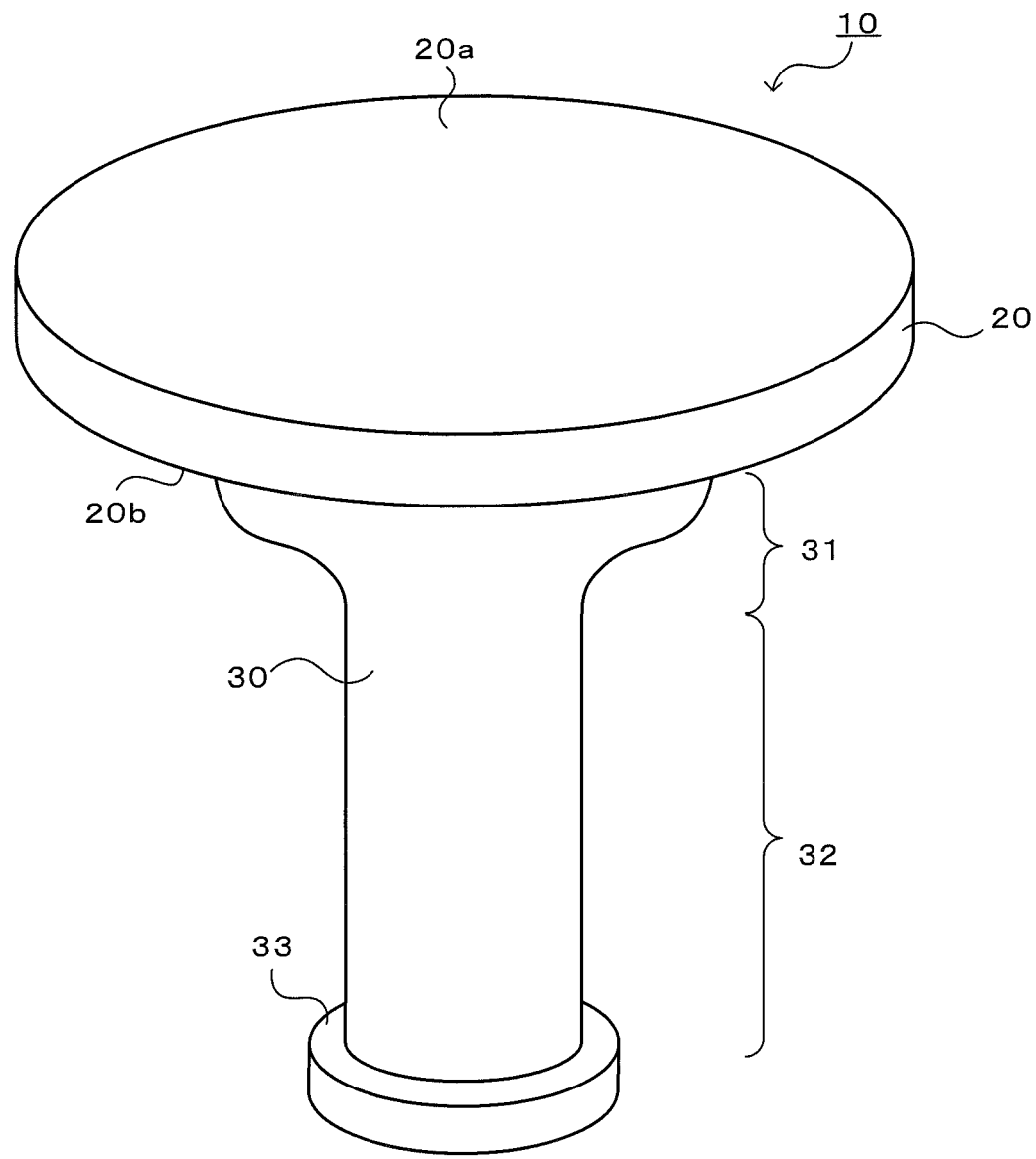
FIG. 1 is a perspective view of a ceramic heater 10 according to an embodiment.
Figure 2:
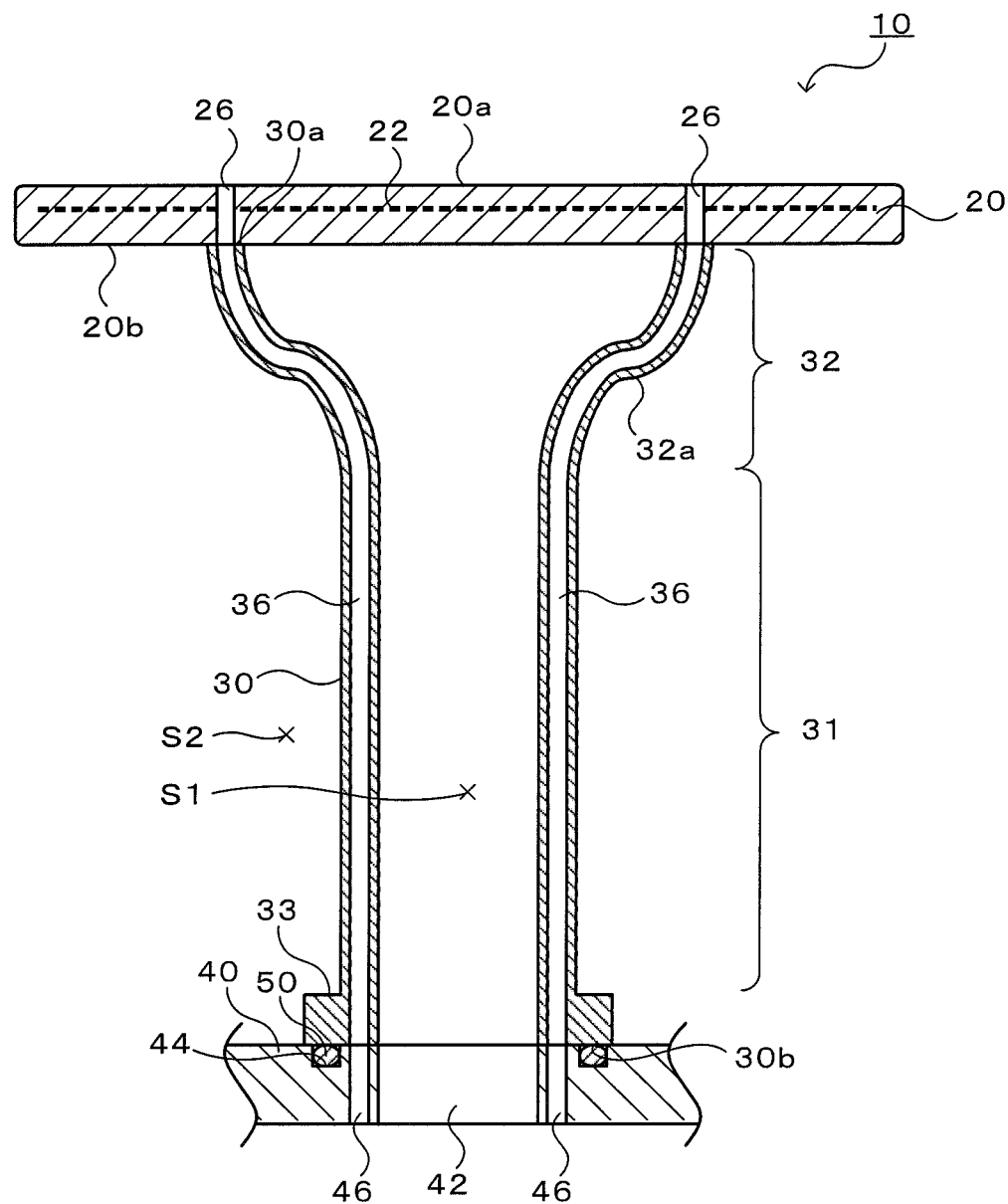
FIG. 2 is a vertical sectional view of the ceramic heater 10.
Figure 3:
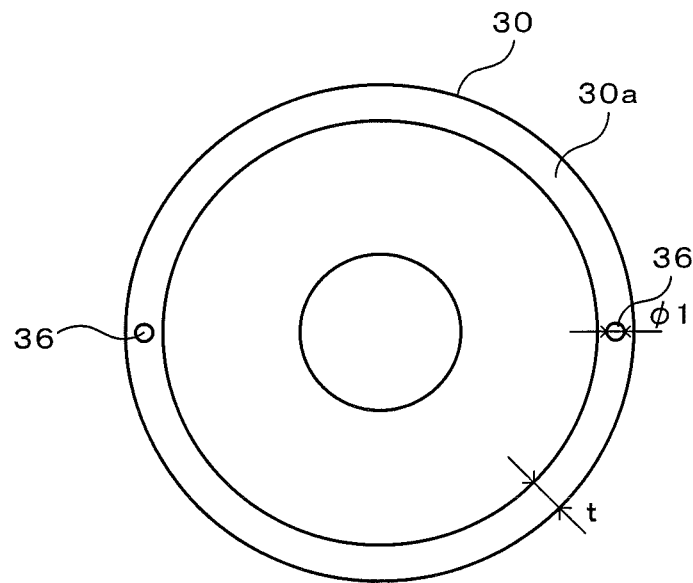
FIG. 3 is a plan view of a tubular shaft 30.
Figure 4:
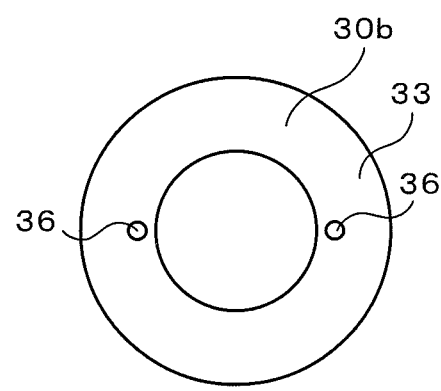
FIG. 4 is a bottom view of the tubular shaft 30.

The preferred embodiments of the present invention will be described below with reference to the drawings. FIG. 1 is a perspective view of a ceramic heater 10, and FIG. 2 is a vertical sectional view of the ceramic heater 10 (i.e., a sectional view when the ceramic heater 10 is sectioned along a plane including a center axis). FIG. 3 is a plan view of a tubular shaft 30, and FIG. 4 is a bottom view of the tubular shaft 30.

The ceramic heater 10 is used to heat a wafer on which processing such as etching or CVD is to be performed, and is installed within a not-illustrated vacuum chamber. The ceramic heater 10 includes a plate 20 on which the wafer can be placed, and a tubular shaft 30 supporting the plate 20.

The plate 20 is a ceramic disk in which a resistance heating element 22 is incorporated. The surface of the plate 20 serves as a wafer placement surface 20a on which the wafer is to be placed. A large number of fine columnar bosses (not illustrated) are formed on the wafer placement surface 20a by embossing, and upper surfaces of the bosses support the wafer. The plate 20 includes a plurality (two in this embodiment) of gas flow holes 26 formed to penetrate the plate 20 in a thickness direction. The gas flow holes 26 are opened in regions of the wafer placement surface 20a between the not-illustrated columnar bosses. A ceramic material of the plate 20 is not limited to particular one, and it may be, for example, aluminum nitride, alumna, silicon carbide, or silicon nitride.

The resistance heating element 22 may have a coil-, ribbon-, mesh-, plate-, or film-like shape, and it may be made of, for example, a material containing, as a main component, W, Mo, Ti, Si or Ni alone or in the form of a compound (such as carbide), a material in combination of those examples, or a mixed material between any of the above examples and a ceramic material used in the plate 20. The resistance heating element 22 is formed in a wiring pattern drawn in a single stroke from one end to the other end over the entirety of the wafer placement surface 20a. The one end and the other end of the resistance heating element 22 are connected to a pair of power feed terminals (not illustrated) that are exposed to an inner space of the tubular shaft 30 from a rear surface 20b of the plate 20. The pair of power feed terminals are connected to an external power supply (not illustrated) via rod-shaped power feed members (not illustrated) that are connected respectively to the pair of power feed terminals. The rod-shaped power feed members are disposed so as to pass through the inner space of the tubular shaft 30. When electric power is supplied to the resistance heating element 22 from the external power supply, the resistance heating element 22 is heated, thus heating the wafer placed on the wafer placement surface 20a.

The tubular shaft 30 is a tubular member made of a ceramic and is joined to the rear surface 20b of the plate 20. The tubular shaft 30 includes a shaft lower portion 31 having a straight shape, and a shaft upper portion 32 having a shape gradually flaring upward in a radially outward direction. The shaft upper portion 32 has a vertical sectional shape that includes, as illustrated in FIG. 2, an S-like shape (in this embodiment, a curved shape having an inflection point 32a). An upper end surface 30a of the tubular shaft 30 is joined to the rear surface 20b of the plate 20. As a ceramic material of the tubular shaft 30, suitable one of the above-mentioned exemplary materials can be used. However, the ceramic material of the tubular shaft 30 is preferably the same as that the plate 20.

The tubular shaft 30 includes a plurality of through-holes 36 penetrating the tubular shaft 30 from the upper end surface 30a to a lower end surface 30b. In this embodiment, as illustrated in FIG. 3, two through-holes 36 are formed at an angular interval of 180° in a circumferential direction of the tubular shaft 30. A diameter φ1 of each through-hole 36 is smaller than a wall thickness t (i.e., a length from an inner circumferential surface to an outer circumferential surface) of the tubular shaft 30. From the viewpoint of reducing thermal stress of the tubular shaft 30, the wall thickness t is preferably 10 mm or less. On the other hand, taking the strength of the tubular shaft 30 into account, the wall thickness t is preferably 6 mm or more. An axis of the through-hole 36 extends, as illustrated in FIG. 2, along the vertical sectional shape of the tubular shaft 30. The through-holes 36 are in communication with gas flow holes 26 of the plate 20.

The tubular shaft 30 includes a flange 33 projecting from an outer circumferential surface of its lower end portion in the radially outward direction. As illustrated in FIG. 2, the lower end surface 30b of the tubular shaft 30 includes a lower end surface of the flange 33 and is attached to the surrounding of a circular hole 42 formed in a plate-shaped base 40 that is one component of a vacuum chamber. More specifically, a donut-shaped recessed groove 44 is formed in the surrounding of the circular hole 42 in the base 40, and the lower end surface 30b of the tubular shaft 30 is fixed to the base 40 by screws, for example, with an O-ring 50 interposed therebetween, the O-ring 50 being made of a fluorine resin (e.g., Teflon (registered trademark)) and fitted to the recessed groove 44. An inner space S1 and an outer space S2 of the tubular shaft 30 are isolated from each other by sealing with the O-ring 50.

The upper end surface 30a of the tubular shaft 30 is joined to the rear surface 20b of the plate 20 by solid-state welding or TCB (Thermal compression bonding). Details of the solid-state welding are stated in Japanese Patent No. 2783980, No. 4070752 and No. 3316167, for example, and details of TCB are stated in Japanese Patent No. 5008875, for example.

The base 40 includes a plurality of (two in this embodiment) insertion holes 46 formed on the radially outward side of the circular hole 42 and penetrating the base 40. The insertion holes 46 of the base 40 are in communication with the gas flow holes 26 of the plate 20 via the through-holes 36 of the tubular shaft 30.

A usage example of the ceramic heater 10 will be described below. First, the ceramic heater 10 is installed in the vacuum chamber, and a wafer is placed on the wafer placement surface 20a of the ceramic heater 10. Then, electric power supplied to the resistance heating element 22 is controlled and a wafer temperature is adjusted to be held at the setting temperature. Heat conducting gas, such as helium gas, argon gas, or nitrogen gas, is supplied to a rear surface of the wafer placed on the wafer placement surface 20a via the insertion holes 46 of the base 40, the through-holes 36 of the tubular shaft 30, and the gas flow holes 26 of the plate 20. The heat conducting gas improves thermal conductivity between the wafer and the wafer placement surface 20a. Then, an inner space of the vacuum chamber is set to a vacuum atmosphere or a low pressure atmosphere, and plasma is generated inside the vacuum chamber. CVD film formation or etching is performed on the wafer by utilizing the generated plasma.

A manufacturing example of the tubular shaft 30 will be described below. A compact (which is designed in a larger size in anticipation of shrinkage during firing) having a similar shape to that of the tubular shaft 30 is fabricated by the slurry additive manufacturing technique using a 3D printer. The fabricated compact is fired, whereby the tubular shaft 30 is obtained. The term "slurry additive manufacturing technique" implies a technique of fabricating the above-mentioned compact in a high-precision and high-speed manner by using slurry that is prepared by dispersing ceramic material powder into a photo- or heat-curable liquid resin. In more detail, a two-dimensional section having a desired shape is formed by coating the slurry over a working region with a mechanically-controlled knife edge, and causing the coated slurry to be optically or thermally cured only in the desired region by solidification of the liquid resin with laser irradiation. The two-dimensional section is laminated next by next by repeating the above-described operation, and the compact having the desired shape is finally obtained.

In the ceramic heater 10 described above, the tubular shaft 30 has the vertical sectional shape including the S-shaped portion. Therefore, a path of heat transfer through the tubular shaft 30 (i.e., a path extending from the upper end surface 30a to the lower end surface 30b of the tubular shaft 30) is prolonged, and a high increase in temperature at the lower end surface 30b of the tubular shaft 30 can be avoided. Accordingly, the O-ring 50 made of the fluorine resin and contacting the lower end surface 30b can be kept lower than the heat resistance temperature, and sealing performance of the O-ring 50 can be maintained for a long period. Furthermore, since each through-hole 36 vertically penetrating the tubular shaft 30 is not formed by joining a lid member such as used in PTL 1, an external appearance is good and a through-hole structure can be maintained for a long period.

Moreover, the through-holes 36 serve as gas paths through which the heat conducting gas flows, and the plate 20 includes the gas flow holes 26 that are in communication with the through-holes 36 and that penetrate the plate 20 in the thickness direction. Since a medium passing through the through-holes 36 is gas, it easily passes through the through-holes 36 regardless of the shape of the through-holes 36. In other words, the gas easily passes through the through-holes 36 even when the vertical sectional shape of the tubular shaft 30 includes the curved portion and the axes of the through-holes 36 extend along the curved shape.

A manufacturing method for the tubular shaft 30 includes (a) a step of fabricating the compact, which has the same or a similar shape as or to that of the tubular shaft 30, with a 3D printer by using slurry that contains ceramic powder, and (b) a step of firing the compact and obtaining the tubular shaft 30. Thus, even when the tubular shaft 30 has the complicated shape as described above, the tubular shaft 30 can be comparatively easily manufactured.

The present invention is not limited to the above-described embodiment, and can be carried out by various modes as long as they belong to the technical scope of the invention.

Figure 5:
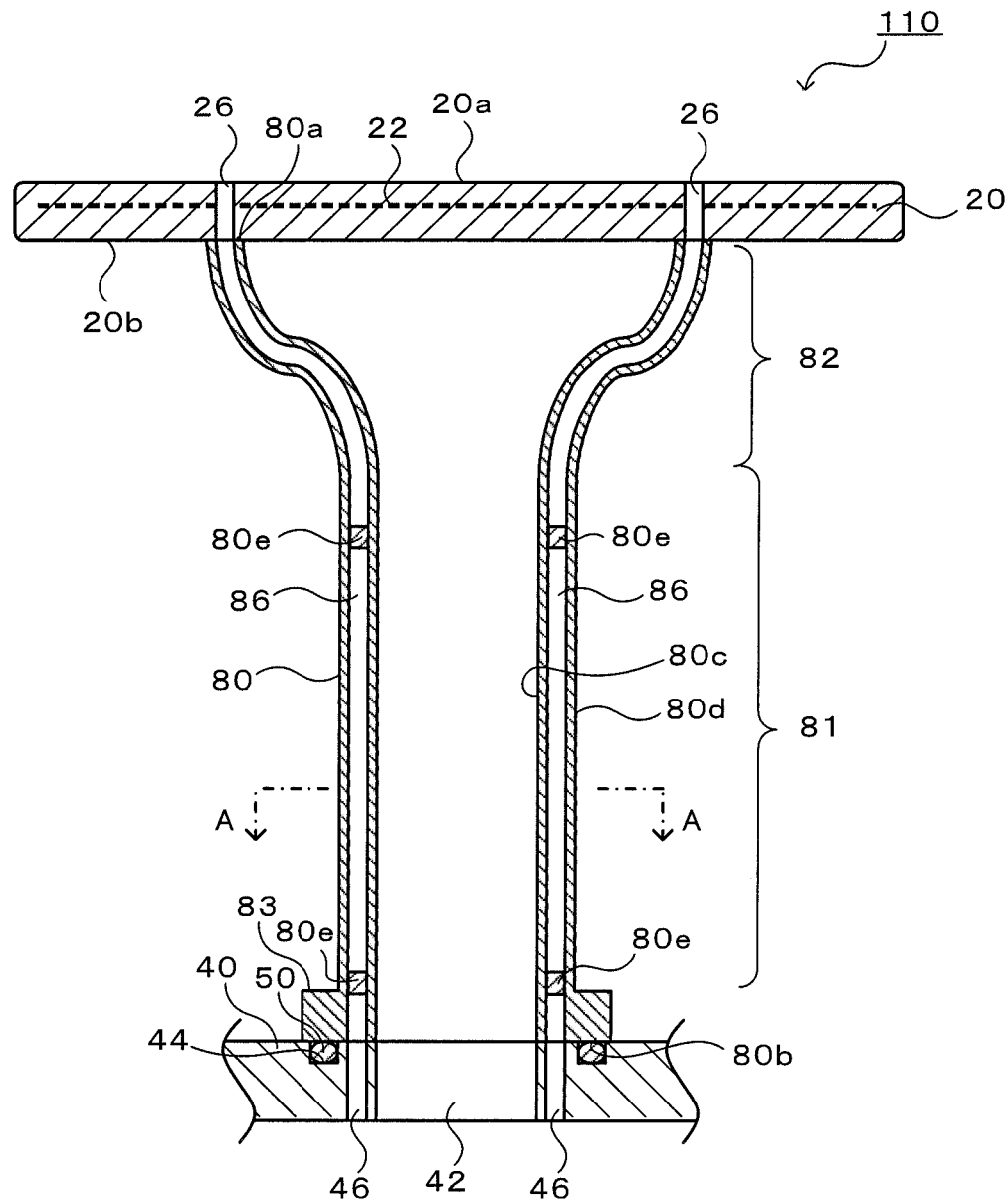
FIG. 5 is a vertical sectional view of a ceramic heater 110.
Figure 6:
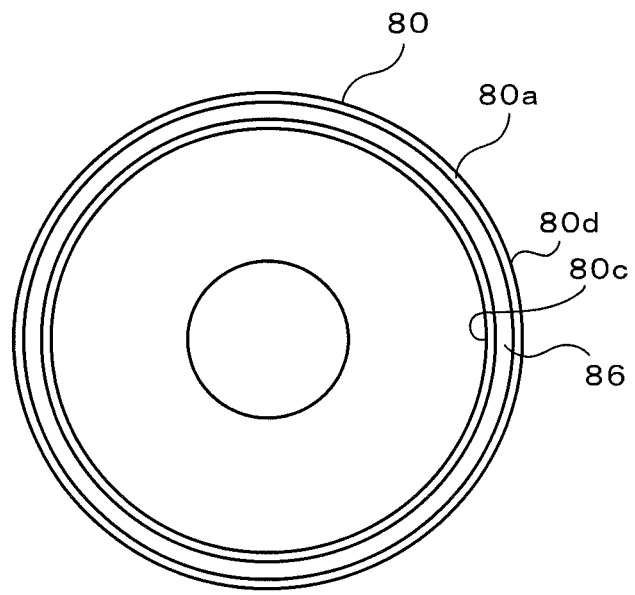
FIG. 6 is a plan view of a tubular shaft 80.
Figure 7:
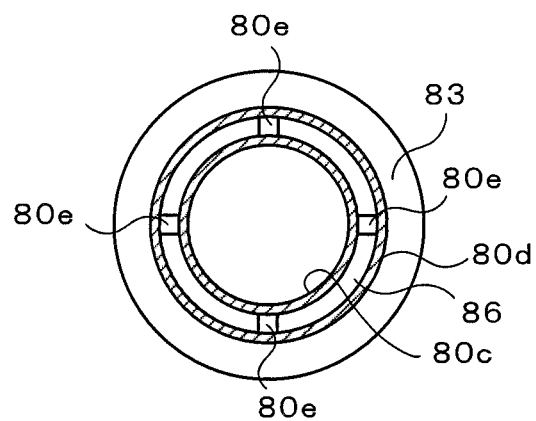
FIG. 7 is a horizontal sectional view of the tubular shaft 80 (sectional view taken along A-A in FIG. 5).

The ceramic heater 10 according to the above embodiment includes, by way of example, the tubular shaft 30 having the through-holes 36, but a tubular shaft 80 having a through-space 86 may be used as in a ceramic heater 110 illustrated in FIGS. 5 to 7. FIG. 5 is a vertical sectional view of the ceramic heater 110, FIG. 6 is a plan view of the tubular shaft 80, and FIG. 7 is a horizontal sectional view of the tubular shaft 80 (sectional view taken along A-A in FIG. 5). In FIGS. 5 to 7, the same components as those in the above embodiment are denoted by the same reference signs. The tubular shaft 80 is similar to the tubular shaft 30 except for including the through-space 86 instead of the through-holes 36. More specifically, the tubular shaft 80 is a tubular member made of a ceramic and is joined to the rear surface 20b of the plate 20. The tubular shaft 80 includes a shaft lower portion 81 having a straight shape, a shaft upper portion 82 having a shape gradually flaring upward in a radially outward direction, and a flange 83 at a lower end. The shaft upper portion 82 has a vertical sectional shape that includes an S-like shape (in this modification, a curved shape having an inflection point). The through-space 86 is a tubular space that penetrates the tubular shaft 80 from an upper end surface 80a to a lower end surface 80b of the tubular shaft 80, and that is formed between an inner circumferential wall 80c and an outer circumferential wall 80d. As illustrated in FIG. 7, a horizontal section of the through-space 86 has a ring-like shape substantially concentric to that of the tubular shaft 80. Coupling portions 80e each partly coupling the inner circumferential wall 80c and the outer circumferential wall 80d are disposed in the through-space 86. Here, total eight coupling portions 80e are disposed such that four coupling portions 80e are positioned at angular intervals of 90° in the circumferential direction for each of upper and lower stages of the tubular shaft 80. The through-space 86 is in communication with not only the insertion holes 46 of the base 40, but also the gas flow holes 26 of the plate 20. The ceramic heater 110 having the above-described structure can also provide similar advantageous effects to those obtained with the above embodiment. In addition, since the tubular shaft 80 has a smaller cross-sectional area than the tubular shaft 30, heat resistance in a path from the upper end surface 80a to the lower end surface 80b of the tubular shaft 80 is increased. As a result, an amount of heat conducted from the upper end surface 80a to the lower end surface 80b of the tubular shaft 80 is reduced, and a temperature difference between a portion of the plate 20, the portion being in contact the tubular shaft 80, and the remaining portion is reduced or eliminated. Since thermal stress is also reduced, damage of the tubular shaft 80 can be prevented during use. Moreover, in the case of using the through-space 86 as a gas path, local concentration of a gas flow can be more reliably prevented than the case of using the through-holes 36 in the above embodiment, and thermal uniformity of the plate 20 is improved.

Figure 8:
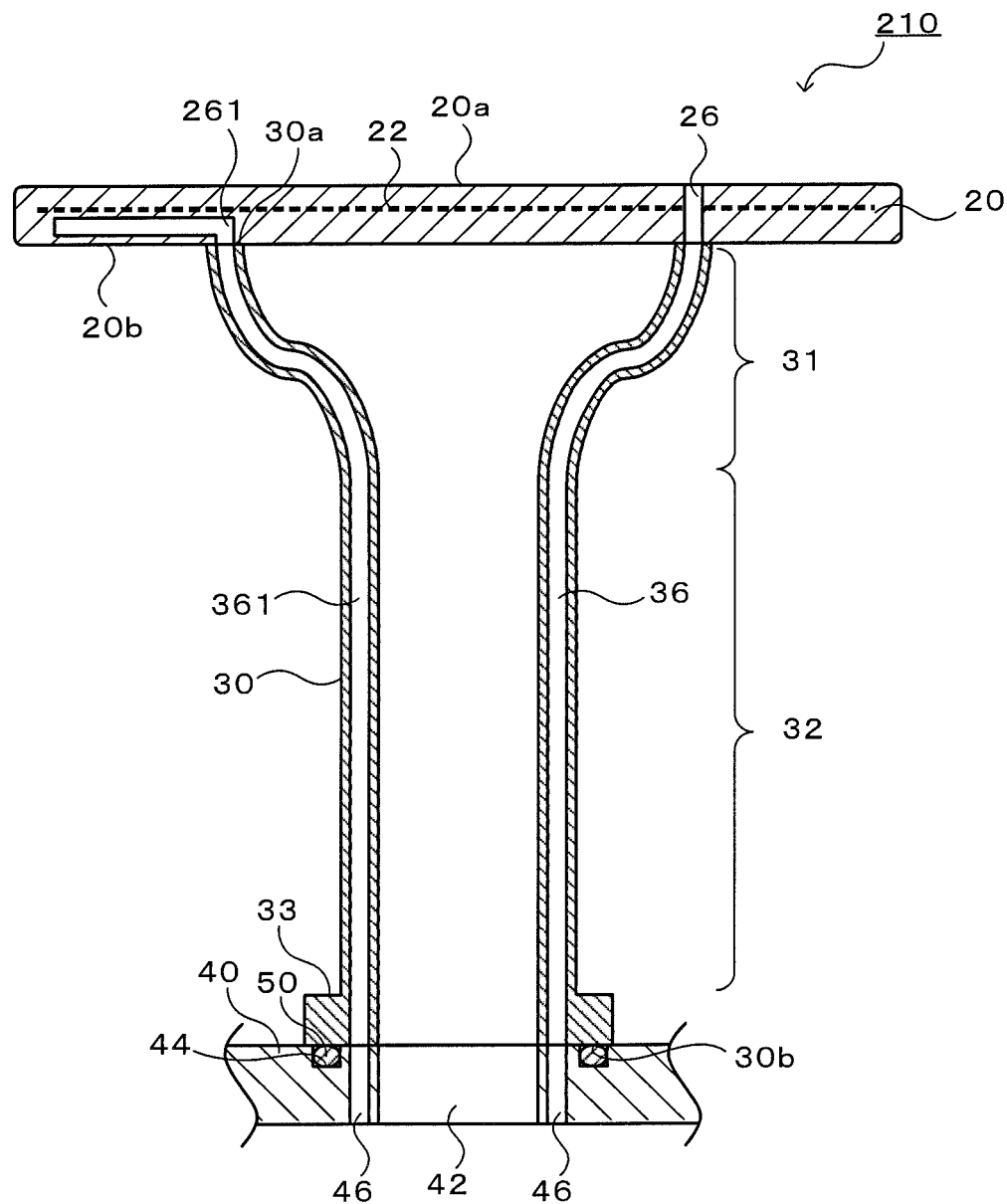
FIG. 8 is a vertical sectional view of a ceramic heater 210.

Although the plurality of through-holes 36 of the tubular shafts 30 are all used as the gas paths in the ceramic heater 10 according to the above embodiment, one through-hole 361 among the plurality of through-holes 36 may be used as a thermocouple installation hole as in a ceramic heater 210 illustrated in FIG. 8. In FIG. 8, the same components as those in the above embodiment are denoted by the same reference signs. In this modification, the plate 20 includes a bottom-equipped hole 261 that is formed therein to be communicated with the through-hole 361, and that has a bent shape with a bottom positioned inside the plate 20. A wire-shaped thermocouple (not illustrated) is disposed, after being passed through the insertion hole 46 of the base 40, the through-hole 361 of the tubular shaft 30, and the bottom-equipped hole 261 of the plate 20, such that a tip of the thermocouple comes into contact with the bottom of the bottom-equipped hole 261. In use of the ceramic heater 210, the electric power supplied to the resistance heating element 22 is adjusted such that a temperature given by the wire-shaped thermocouple is kept in match with the setting temperature. The bottom-equipped hole 261 has the bent shape in FIG. 8, but it may have a vertically extending shape.

Figure 9:
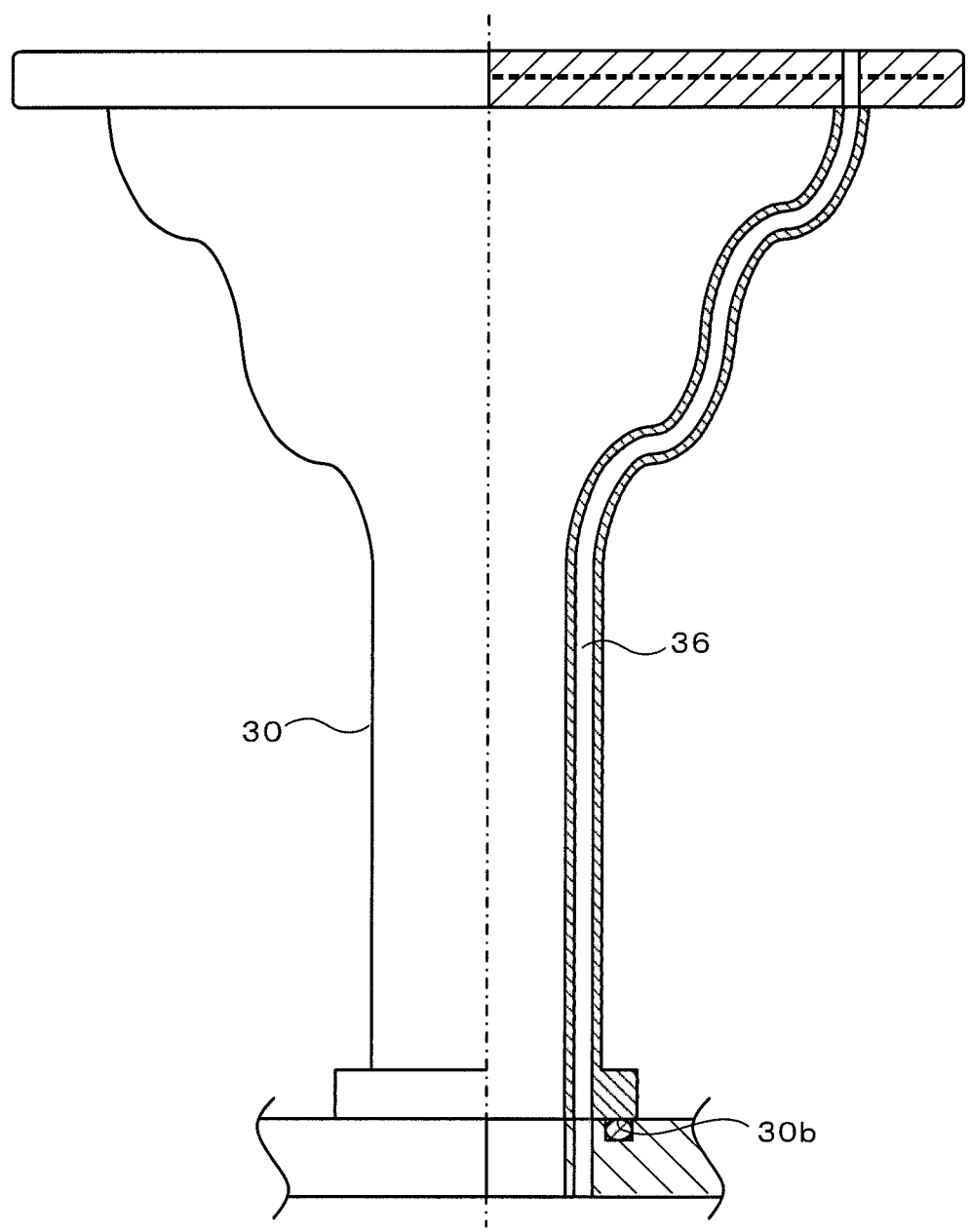
FIG. 9 is a vertical sectional view of a modification of the ceramic heater 10.

The above embodiment may be modified, as illustrated in FIG. 9, such that the sectional shape of the tubular shaft 30 has a curved shape including two S-like portions and the axes of the through-holes 36 extend along the curved shape. Even in such a structure, the through-holes 36 serve as gas paths, and the gas easily passes through the through-holes 36. Furthermore, since the sectional shape of the tubular shaft 30 has the curved shape including two S-like portions, the path of the heat transfer through the tubular shaft 30 can be further prolonged, and a high increase in temperature at the lower end surface 30b of the tubular shaft 30 can be more reliably avoided.

While, in the above embodiment, the through-hole 36 is used as the gas path through which the heat conducting gas flows, it may be used as a gas path for vacuum suction. In this case, since the gas is evacuated from the rear surface side of the wafer placed on the wafer placement surface 20a and a vacuum atmosphere is generated on the rear surface side of the wafer, the wafer can be attracted toward the wafer placement surface 20a.

While the above embodiment has been described, by way of example, in connection with the case in which the resistance heating element 22 is incorporated in the plate 20, an electrostatic electrode or a high-frequency electrode may be incorporated in the plate 20 in addition to the resistance heating element 22. The electrostatic electrode is an electrode used to attract the wafer toward the wafer placement surface 20a, and the high-frequency electrode is an electrode used to generate plasma.

While the tubular shaft 30 is fabricated using the 3D printer in the above embodiment, the tubular shaft 30 may be obtained by fabricating a compact with a mold casting method using a mold having a similar shape to that of the tubular shaft 30 (i.e., a near-net shape mold), and by firing the fabricated compact. The term "mold casting method" implies a method of obtaining a compact by pouring ceramic slurry, which contains ceramic material powder and a molding agent, into a mold, and by causing the molding agent to develop chemical reaction inside the mold, thus molding the ceramic slurry. The molding agent may be an agent that contains isocyanate and polyol, and that effectuates the molding by urethane reaction. Ceramic slurry used in the mold casting method may be utilized as the slurry that is supplied to the 3D printer.

The present application claims priority of Japanese Patent Application No. 2018-160303 filed on Aug. 29, 2018, the entire contents of which are incorporated herein by reference.

What is claimed is:

1. A ceramic heater comprising a ceramic plate having a wafer placement surface on which a wafer is to be placed, and incorporating a resistance heating element therein, and a ceramic tubular shaft having one end joined to a rear surface of the plate,
    wherein the tubular shaft has a vertical sectional shape including an S-like portion or a curved portion having an inflection point in at least one position within the curved portion, and includes a through-hole penetrating the tubular shaft from the one end to the other end with an axis extending along the vertical sectional shape of the tubular shaft.

2. The ceramic heater according to claim 1, wherein the through-hole is a gas supply hole or a vacuum suction hole, and
    the plate includes a gas flow hole communicating with the through-hole and penetrating the plate in a thickness direction.

3. The ceramic heater according to claim 1, wherein the through-hole is a thermocouple installation hole, and
    the plate includes a bottom-equipped hole communicating with the thermocouple installation hole and having a bottom inside the plate.

4. The ceramic heater according to claim 1, wherein the through-hole is a hole having a diameter smaller than a wall thickness of the tubular shaft.

5. The ceramic heater according to claim 1, wherein the through-hole is a tubular space between an inner circumferential wall and an outer circumferential wall of the tubular shaft, a horizontal section of the tubular space has a ring-like shape concentric to a horizontal section of the tubular shaft, and a coupling portion partly coupling the inner circumferential wall and the outer circumferential wall is disposed in the tubular space.

6. The ceramic heater according to claim 1, wherein a wall thickness of the tubular shaft is 10 mm or less.

7. A manufacturing method for a tubular shaft made of a ceramic, having a vertical sectional shape including an S-like portion or a curved portion having an inflection point in at least one position within the curved portion, and including a through-hole penetrating the tubular shaft from one end to the other end with an axis extending along the vertical sectional shape of the tubular shaft, the manufacturing method comprising steps of:

(a) fabricating a compact having the same or a similar shape as or to a shape of the tubular shaft with a 3D printer by using slurry containing ceramic powder, or fabricating a compact having the same or a similar shape as or to a shape of the tubular shaft with a mold casting method by using slurry containing ceramic powder; and (b) obtaining the tubular shaft by firing the fabricated compact, wherein one end of the ceramic tubular shaft is joined to a rear surface of a ceramic plate of a ceramic heater having a wafer placement surface and a resistance heating element incorporated therein.

* * * * *